United States Patent
Chung et al.

(10) Patent No.: US 10,662,547 B2
(45) Date of Patent: May 26, 2020

(54) SILICON-BASED MOLTEN COMPOSITION AND MANUFACTURING METHOD OF SIC SINGLE CRYSTAL USING THE SAME

(71) Applicant: LG Chem, Ltd., Seoul (KR)

(72) Inventors: Chan Yeup Chung, Daejeon (KR); Ho Rim Lee, Daejeon (KR); Jung Min Ko, Daejeon (KR); Dae Sung Kim, Daejeon (KR); Sung Soo Lee, Daejeon (KR); Chang Sun Eun, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/754,830

(22) PCT Filed: Oct. 25, 2016

(86) PCT No.: PCT/KR2016/012019
§ 371 (c)(1),
(2) Date: Feb. 23, 2018

(87) PCT Pub. No.: WO2017/073983
PCT Pub. Date: May 4, 2017

(65) Prior Publication Data
US 2018/0245235 A1    Aug. 30, 2018

(30) Foreign Application Priority Data
Oct. 26, 2015    (KR) .................. 10-2015-0148846

(51) Int. Cl.
*C30B 9/10*     (2006.01)
*C30B 29/36*    (2006.01)
(Continued)

(52) U.S. Cl.
CPC ............. *C30B 9/10* (2013.01); *C30B 9/06* (2013.01); *C30B 19/02* (2013.01); *C30B 19/04* (2013.01);
(Continued)

(58) Field of Classification Search
CPC ............ C30B 29/36; C30B 9/10; C30B 19/02
See application file for complete search history.

(56) References Cited

U.S. PATENT DOCUMENTS

2008/0190355 A1  8/2008  Chen et al.
2009/0178610 A1  7/2009  Sakamoto et al.
(Continued)

FOREIGN PATENT DOCUMENTS

JP  2000264790 A  9/2000
JP  2008100890 A  5/2008
(Continued)

OTHER PUBLICATIONS

Extended European Search Report including Written Opinion for Application No. EP16860166.4 dated May 29, 2018.
(Continued)

*Primary Examiner* — Matthew J Song
(74) *Attorney, Agent, or Firm* — Lerner, David, Littenberg, Krumholz & Mentlik, LLP

(57) ABSTRACT

The present invention relates to a silicon-based molten composition for forming a SiC single crystal by a solution method, the composition containing silicon, carbon, and a metal satisfying 0.70≤Csisol≤1.510 with respect to a solubility parameter (Csisol) defined by the following Equation (1):

$$Csisol = A - B + \mu_1 - \mu_2 \qquad \text{Equation (1)}$$

wherein, A is first energy (A) of a first evaluation lattice containing silicon atoms, carbon atoms, and metal atoms, in a silicon crystal lattice containing the metal and the carbon; B is second energy (B) of a second evaluation lattice containing silicon atoms and metal (Continued)

atoms, in a silicon crystal lattice containing the metal; µ1 is −5.422 as a constant value, and µ2 is −9.097 as a constant value.

18 Claims, 5 Drawing Sheets

(51) Int. Cl.
 H01L 21/02 (2006.01)
 C30B 9/06 (2006.01)
 C30B 19/04 (2006.01)
 C30B 19/02 (2006.01)
(52) U.S. Cl.
 CPC ............. *C30B 29/36* (2013.01); *H01L 21/02* (2013.01); *H01L 21/02378* (2013.01); *H01L 21/02529* (2013.01); *H01L 21/02625* (2013.01); *H01L 21/02628* (2013.01)

(56) References Cited

U.S. PATENT DOCUMENTS

| | | | |
|---|---|---|---|
| 2010/0083896 A1 | 4/2010 | Sakamoto | |
| 2012/0132130 A1 | 5/2012 | Nomura et al. | |
| 2012/0237428 A1 | 9/2012 | Ryo et al. | |
| 2015/0159297 A1 | 6/2015 | Shinya et al. | |
| 2015/0159299 A1* | 6/2015 | Shinya | C30B 13/02 117/35 |
| 2016/0273126 A1* | 9/2016 | Kusunoki | C30B 9/06 |
| 2016/0340795 A1* | 11/2016 | Domoto | C30B 15/14 |
| 2017/0170279 A1 | 6/2017 | Domoto et al. | |
| 2017/0370018 A1* | 12/2017 | Domoto | C30B 15/20 |
| 2018/0016703 A1* | 1/2018 | Domoto | C30B 19/04 |

FOREIGN PATENT DOCUMENTS

| | | |
|---|---|---|
| JP | 4811354 B2 | 11/2011 |
| JP | 2012111669 A | 6/2012 |
| JP | 5483216 B2 | 5/2014 |
| JP | 2015067489 A | 4/2015 |
| JP | 2015110496 A | 6/2015 |
| KR | 20110086986 A | 8/2011 |
| KR | 101070412 B1 | 10/2011 |
| KR | 20120057536 A | 6/2012 |
| KR | 20140094831 A | 7/2014 |
| KR | 20150066458 A | 6/2015 |
| KR | 20150066459 A | 6/2015 |
| WO | 2015072136 A1 | 5/2015 |
| WO | 2015129876 A1 | 9/2015 |

OTHER PUBLICATIONS

International Search Report for Application No. PCT/KR2016/012019, dated Feb. 10, 2017.

Tajima, Y. and Kingery, W.D., Solid Solubility of Aluminum and Boron in Silicon Carbide, Journal of the American Ceramic Society, Feb. 1982, pp. C-27-C-29, vol. 65, No. 2.

Hähnel, A., et al., Nanostructuring in Ni/SiC reaction layers, investigated by imaging of atomic columns and DFT calculations, Materials Chemistry and Physics, Apr. 15, 2009, pp. 802-808, vol. 114, Issues 2-3.

\* cited by examiner

SILICON-BASED MOLTEN COMPOSITION AND MANUFACTURING METHOD OF SIC SINGLE CRYSTAL USING THE SAME

CROSS-REFERENCE TO RELATED APPLICATION

This application is a national phase entry under 35 U.S.C. § 371 of International Application No. PCT/KR2016/012019, filed Oct. 25, 2016 which claims priority to Korean Patent Application No. 10-2015-0148846, Oct. 26, 2015, the disclosures of which are incorporated herein by reference.

TECHNICAL FIELD

The present invention relates to a melt silicon-based composition and a manufacturing method of a SiC single crystal using the same.

BACKGROUND ART

A SiC single crystal has been studied as a substrate for a power semiconductor device. The SiC single crystal has excellent band gap and dielectric breakdown strength as compared to existing silicon. A semiconductor using this SiC substrate may be used at high power and minimize damages caused by energy conversion.

Further, since an apparatus including the SiC substrate may operate at a high temperature, it is possible to prevent a device from being damaged by thermal desorption and it is expected to simplify a cooling apparatus, such that the SiC single crystal may be utilized as a next generation power semiconductor device capable of replacing silicon.

As a growth method of the SiC single crystal as described above, a sublimation method, a chemical vapor deposition (CVD) method, an Acheson method, a solution method, and the like, are known. Among them, the solution method is a method of precipitating and growing the SiC single crystal on a seed crystal from a molten solution containing silicon and carbon after dissolving silicon or a silicon-containing alloy in a crucible.

DISCLOSURE

Technical Problem

The present invention has been made in an effort to provide a silicon-based molten composition and a manufacturing method of a SiC single crystal using the same. More particularly, the present invention has been made in an effort to provide a silicon-based molten composition having advantages of improving solubility of carbon by containing a metal having a predetermined level of a solubility parameter ($C_{si}^{sol}$) value, and a manufacturing method of a SiC single crystal using the same.

Technical Solution

An exemplary embodiment of the present invention provides a silicon-based molten composition for forming a SiC single crystal by a solution method, the silicon-based molten composition containing silicon, carbon, and a metal satisfying $0.70 \leq C_{si}^{sol} \leq 1.510$ with respect to a solubility parameter ($C_{si}^{sol}$) defined by the following Equation (1):

$$C_{si}^{sol} = A - B + \mu_1 - \mu_2 \qquad \text{Equation (1)}$$

wherein, A is first energy (A) of a first evaluation lattice containing silicon atoms, carbon atoms, and metal atoms, in a silicon crystal lattice containing the metal atoms and the carbon atoms; B is second energy (B) of a second evaluation lattice containing silicon atoms and metal atoms, in a silicon crystal lattice containing the metal atoms; $\mu_1$ is −5.422 as a constant value, which is a chemical potential obtained by dividing total energy of diamond crystal structured silicon by the number of silicon atoms present in a unit lattice; and $\mu_2$ is −9.097 as a constant value, which is a chemical potential obtained by dividing total energy of diamond crystal structured carbon by the number of carbon atoms present in the unit lattice.

The metal may satisfy $0.72 \leq C_{si}^{sol} \leq 1.36$ with respect to the solubility parameter ($C_{si}^{sol}$) defined by Equation (1).

The metal may include at least two kinds of metals.

The metal may include at least two kinds of metals selected from the group consisting of aluminum, nickel, hafnium, gallium, and tantalum.

The metal may be contained in a content of 25 to 85 parts by weight based on 100 parts by total weight of silicon.

The metal may be contained in a content of 20 to 50 at %.

Another embodiment of the present invention provides a manufacturing method of a SiC single crystal, the manufacturing method including: preparing a SiC seed crystal; preparing a molten solution containing silicon, carbon, and a metal; and supercooling the molten solution to grow a SiC single crystal on the SiC seed crystal, wherein the metal satisfies $0.70 \leq C_{si}^{sol} \leq 1.510$ with respect to the solubility parameter ($C_{si}^{sol}$) defined by Equation (1):

$$C_{si}^{sol} = A - B + \mu_1 - \mu_2 \qquad \text{Equation (1)}$$

wherein, A is first energy (A) of a first evaluation lattice containing silicon atoms, carbon atoms, and metal atoms, in a silicon crystal lattice containing the metal atoms and the carbon atoms; B is second energy (B) of a second evaluation lattice containing silicon atoms and metal atoms, in a silicon crystal lattice containing the metal atoms; $\mu_1$ is −5.422 as a constant value, which is a chemical potential obtained by dividing total energy of diamond crystal structured silicon by the number of silicon atoms present in a unit lattice; and $\mu_2$ −9.097 as a constant value, which is a chemical potential obtained by dividing total energy of diamond crystal structured carbon by the number of carbon atoms present in the unit lattice.

Force applied to the silicon atom, the carbon atom, and the metal atom in the first evaluation lattice may be ±0.01 eV/Å or less.

Force applied to the silicon atom and metal atom in the second evaluation lattice may be ±0.01 eV/Å or less.

The first energy may be deduced by a process of substituting the silicon atom with the metal atom in a silicon crystal lattice and a process of substituting the silicon atom with the carbon atom to form the first evaluation lattice.

The second energy may be deduced by a process of substituting the silicon atom with the metal atom in the silicon crystal lattice to form the second evaluation lattice.

The metal atom may include first and second metal atoms different from each other, and a distance between the first and second metal atoms may be 5 Å or less.

The first evaluation lattice may contain the carbon atom, the silicon atom, and the metal atom, which are positioned within a radius of 6 Å based on the carbon atom.

The second evaluation lattice may contain the silicon atom and the metal atom, which are positioned within a radius of 6 Å based on the silicon atom positioned adjacently to the metal atom.

The first energy, the second energy, the first constant, and the second constant may be deduced using a density functional theory (DFT) method using a Vienna Ab-Initio Simulation Package (VASP) code.

Advantageous Effects

According to an embodiment of the present invention, the silicon-based molten composition as described above may contain the metal having a predetermined level of a solubility parameter value, and solubility of carbon in the silicon-based molten composition may be improved by the metal. Further, a yield of the SiC single crystal may be improved by improvement of the solubility as described above.

DESCRIPTION OF THE DRAWINGS

(a) of FIG. 3 is a morphological simulation image according to Example, and (b) of FIG. 3 is a morphological simulation image according to Comparative Example.

MODE FOR INVENTION

The present invention may be variously modified and have various types, and specific embodiments of the present invention will be descried in detail with reference to the accompanying drawing. However, the present invention is not limited to the exemplary embodiments described herein, but all of the modifications, equivalents, and substitutions within the spirit and scope of the present invention are also included in the present invention.

A silicon-based molten composition according to an exemplary embodiment of the present invention may contain silicon, carbon, and a metal satisfying $0.70 \leq C_{si}^{sol} \leq 1.510$, more preferably, $0.72 \leq C_{si}^{sol} \leq 1.36$ with respect to a solubility parameter ($C_{si}^{sol}$) defined by the following Equation (1).

$$C_{si}^{sol} = A - B + \mu_1 - \mu_2 \quad \text{Equation (1)}$$

In Equation (1), A is first energy (A) of a first evaluation lattice containing silicon atoms, carbon atoms, and metal atoms, in a silicon crystal lattice containing the metal atoms and the carbon atoms; B is second energy (B) of a second evaluation lattice containing silicon atoms and metal atoms, in a silicon crystal lattice containing the metal atoms; $\mu_1$ is −5.422 as a constant value, which is a chemical potential obtained by dividing total energy of diamond crystal structured silicon by the number of silicon atoms present in a unit lattice; and $\mu_2$ is −9.097 as a constant value, which is a chemical potential obtained by dividing total energy of diamond crystal structured carbon by the number of carbon atoms present in the unit lattice.

The solubility parameter ($C_{si}^{sol}$) value of the silicon-based molten composition according to the exemplary embodiment of the present invention is 1.510 or less. The reason is that a solubility parameter ($C_{si}^{sol}$) value in a case in which the metal is not contained is 1.510, and a numerical value of 1.510 or less indicates that the silicon-based molten composition is more stable in view of thermodynamics.

Further, the solubility parameter ($C_{si}^{sol}$) value of the silicon-based molten composition according to the exemplary embodiment of the present invention is 0.70 or more. Therefore, the metal may include any metal satisfying $0.70 \leq C_{si}^{sol} \leq 1.510$.

The metal according to the exemplary embodiment of the present invention may include at least two kinds of metals. Any combination of at least two kinds of metals may be used as long as these metals may satisfy $0.70 \leq C_{si}^{sol} \leq 1.510$, more preferably, $0.72 \leq C_{si}^{sol} \leq 1.36$ with respect to the solubility parameter ($C_{si}^{sol}$) defined by Equation (1).

At least two kinds of metal may include one selected from a first group consisting of nickel (Ni), hafnium (Hf), gallium (Ga), and tantalum (Ta) and one selected from a second group consisting of aluminum (Al), tantalum (Ta), and hafnium (Hf). As an example, the metal may include a combination of aluminum and nickel, a combination of aluminum and hafnium, a combination of gallium and tantalum, a combination of gallium and hafnium, or a combination of aluminum and tantalum. For example, in the case in which the metal includes aluminum and nickel, the solubility parameter value may be 0.72 to 0.73, or 0.721, in the case in which the metal includes hafnium and nickel, the solubility parameter value may be 0.92 to 0.93, or 0.928, in the case in which the metal includes tantalum and aluminum, the solubility parameter value may be 1.03 to 1.04, or 1.032, in the case in which the metal includes gallium and tantalum, the solubility parameter value may be 1.35 to 1.36, or 1.359, and in the case in which the metal includes gallium and hafnium, the solubility parameter value may be 1.30 to 1.31, or 1.308.

The metal may be contained in a content of 25 to 85 parts by weight based on 100 parts by total weight of silicon. Alternatively, the metal may be contained in a content of 20 to 50 at %, 30 to 50 at %, or 35 to 45 at % based on the silicon-based molten composition. In the case in which the content of the metal is excessively low based on the total weight of silicon, solubility of carbon in the silicon-based molten solution is low, and it is impossible to obtain a sufficient growth rate of a SiC single crystal. Further, in the case in which the content of the metal is excessively high based on the total weight of silicon, a compound of silicon and the metal may be formed, or polycrystallization of SiC may easily occur, such that growth of the single crystal may be difficult.

Further, in the case in which the metal includes at least two kinds of metals different from each other, the content of the metal may satisfy the above-mentioned parts by weight.

Therefore, regardless of the kind of metals, the metal may be contained in a content of 25 to 85 parts by weight, preferably, 60 to 70 parts by weight based on 100 parts by total weight of silicon. Alternatively, regardless of the kind of metal, the metal may be contained in a content of 20 to 50 at % based on the silicon-based molten composition.

Further, the metal may be positioned in the silicon crystal lattice or an interstitial site between the silicon crystal lattices according to the exemplary embodiment of the present invention. As an example, hafnium and tantalum may be positioned in an interstitial site between the silicon crystal lattices, and increase a distance between silicon atoms positioned in the silicon crystal lattice. The metal positioned in the interstitial site between the silicon crystal lattices may allow carbon atoms to be more easily positioned in the silicon crystal lattice, thereby making it possible to improve solubility of carbon in the silicon-based molten solution.

In the case in which the silicon-based molten composition contains the metal having a solubility parameter value within the above-mentioned range, solubility of carbon in the silicon-based molten composition may be excellent.

Hereinafter, a process of deducing the solubility parameter ($C_{si}^{sol}$) defined by Equation (1) will be described in detail. The silicon-based molten composition according to the present invention may contain at least two kinds of metals as described above. Hereinafter, a case in which the silicon-based molten composition contains first and second metal atoms will be described by way of example.

However, the metal is not limited thereto, but may be a single metal or include at least three kinds of metals. In the case in which the metal is a single metal, the first and second metal atoms may be substituted with single metal atoms, and in the case in which the metal includes three kinds of metals, the first and second metal atoms may be substituted with first to third metal atoms.

A process of deducing the first energy (A) will be described.

A silicon crystal lattice having a diamond crystal structure is prepared. The silicon crystal lattice means a 2×2×2 supercell obtained by extending a silicon unit cell having a diamond crystal structure two times in X, Y, and Z crystal axis directions. In addition, preferably, a condition at which a k-point mesh in a reciprocal lattice for calculating energy (eigenvalue) of electrons includes only gamma point is used.

Particularly, the silicon-based molten composition actually has an amorphous structure, but in the amorphous structure, it is impossible to specify an atomic structure and there are various numbers of cases even in the same component composition. Therefore, in the process of deducing the first energy according to the exemplary embodiment in the present invention, the silicon crystal lattice is assumed to be a crystal lattice having a three-dimensional periodic boundary condition, and in all calculation of energy, the silicon crystal lattice having crystalline structure is used.

Figure 1:
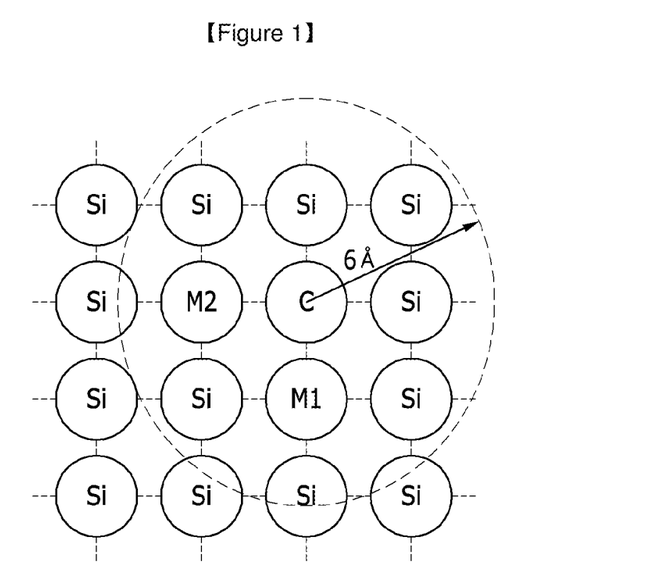
FIG. 1 is a plan view of a first evaluation lattice according to an exemplary embodiment of the present invention.

Next, as illustrated in FIG. 1, one of arbitrary silicon atoms in the silicon crystal lattice is substituted with a first metal atom M1. Then, another arbitrary silicon atom in the silicon crystal lattice containing the substituted first metal atom M1 is substituted with a second metal atom M2.

Here, the first and second metal atoms are positioned adjacent to each other in a column or row direction, such that the first and second metal atoms are not bound to each other. Particularly, it is preferable that an interval between the first and second metal atoms is 5 Å or less.

That is, as illustrated in FIG. 1, the first and second metal atoms may be positioned so as to face each other in a diagonal direction and have an interval of 5 Å or less therebetween. However, positions of the first and second metal atoms are not limited thereto, but may be variously changed as long as the above-mentioned condition is satisfied.

After some atoms in the silicon crystal lattice having the diamond crystal structure are substituted with the first and second metal atoms, a silicon atom positioned between the first and second metal atoms is substituted with a carbon atom C.

Next, a structural optimization process is performed so that force applied to the silicon atom, the carbon atom, and the first and second metal atoms is ±0.01 eV/Å or less.

In detail, structural optimization is performed by performing repetitive calculation so that the Force applied to the silicon atom, the carbon atom, and the first and second metal atoms is within the above-mentioned range. Preferably, repetitive calculation is performed until force applied to each of the atoms, obtained by calculating electron energy is smaller than ±0.01 eV/Å, thereby finding an optimal atomic structure.

Further, in order to obtain a crystal lattice which contains the carbon atom, the first and second metal atoms, and the silicon atom and is structurally optimized, optimization is performed on a lattice positioned within a radius of 6 Å based on the carbon atom C positioned between the first and second metal atoms M1 and M2. Here, the crystal lattice positioned within a radius of 6 Å based on the carbon atom positioned between the first and second metal atoms is defined as a first evaluation lattice. That is, the first evaluation lattice contains the first and second metal atoms, the silicon atom, and the carbon atom.

After structural optimization is completed, first energy (A), which is total energy of the first evaluation lattice containing the carbon atom, the first and second metal atoms, and the silicon atoms, is deduced.

Here, the first energy (A) may be deduced using a density functional theory (DFT) method using a Vienna Ab-Initio Simulation Package (VASP) code in a case in which the first evaluation lattice is in an electronic ground state.

In detail, the first energy (A) may be calculated using a plane wave-based DFT method using the VSAP code. In calculation based on the DFT method, exchange-correlation for interaction between electrons was evaluated by the generalized-gradient approximation (GGA) using the Perdew-Burke-Ernzerhof (PBE) function. Further, a kinetic energy cutoff of electrons is set to 400 eV, and in energy smearing, a Gaussian method is used.

Further, in order to obtain accurate energy with respect to the evaluation lattice containing the metal atom, all calculation relates to total energy considering spin polarization. In addition, for efficiency of calculation, a pseudopotential method is used instead of an all electron method in which all electrons are reflected in calculation, and a basic pseudopotential is applied to each element included in a VASP package.

Next, a process of deducing the second energy (B) will be described.

A silicon crystal lattice having a diamond crystal structure is prepared. The silicon crystal lattice means a 2×2×2 supercell obtained by extending a silicon unit cell having a diamond crystal structure two times in X, Y, and Z crystal axis directions. In addition, preferably, a condition at which a k-point mesh in a reciprocal lattice for calculating energy (eigenvalue) of electron includes only gamma point is used.

Particularly, the silicon-based molten composition actually has an amorphous structure, but in the amorphous structure, it is impossible to specify an atomic structure and there are various numbers of cases even in the same component composition. Therefore, in the process of deducing the second energy according to the exemplary embodiment in the present invention, the silicon crystal lattice is assumed to be a crystal lattice having a three-dimensional periodic boundary condition, and in all calculation of energy, the silicon crystal lattice having crystalline structure is used.

Figure 2:
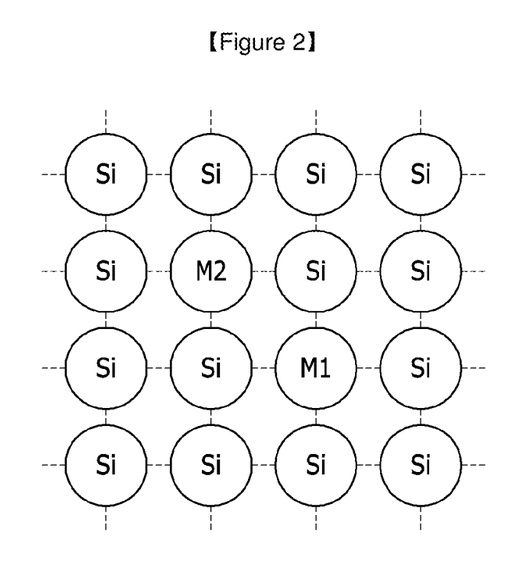
FIG. 2 is a plan view of a second evaluation lattice according to the exemplary embodiment of the present invention.

Next, as illustrated in FIG. 2, one of arbitrary silicon atoms in the silicon crystal lattice is substituted with a first metal atom M1. Another arbitrary silicon atom in the silicon crystal lattice containing the substituted first metal atom M1 is substituted with a second metal atom M2.

Here, the first and second metal atoms are not bound to each other, and particularly, they are not positioned adjacent to each other in a column or row direction. Here, it is preferable that an interval between the first and second metal atoms is 5 Å or less. For example, as illustrated in FIG. 2, the first and second metal atoms may be positioned so as to face each other in a diagonal direction and have an interval of 5 Å or less therebetween. However, positions of the first and second metal atoms are not limited thereto, but may be variously changed as long as the above-mentioned condition is satisfied.

Next, a structural optimization process is performed so that force applied to the silicon atom and the first and second metal atoms is ±0.01 eV/Å or less. In detail, structural optimization is performed by performing repetitive calculation so that the force applied to the silicon atom and the first and second metal atoms is within the above-mentioned range. Preferably, repetitive calculation is performed until force applied to each of the atoms, obtained by calculating electron energy is smaller than ±0.01 eV/Å, thereby finding an optimal atomic structure.

In addition, at the time of performing structural optimization, structural optimization is performed on a lattice positioned within a radius of 6 Å based on the silicon atom positioned between the first and second metal atoms M1 and M2. In this case, the crystal lattice positioned within a radius of 6 Å based on the silicon atom positioned between the first and second metal atoms is defined as a second evaluation lattice. The second evaluation lattice contains the first and second metal atoms and the silicon atom.

After structural optimization is completed, the second energy (B) of the second evaluation lattice containing the first and second metal atoms and the silicon atoms is deduced.

Here, the second energy (B) may be deduced using a density functional theory (DFT) method using a Vienna Ab-Initio Simulation Package (VASP) code in a case in which the second evaluation lattice is in an electronic ground state, and a description of a method of deducing the second energy (B) similar to or equal to the method of deducing the first energy (A) will be omitted.

The solubility parameter ($C_{si}^{sol}$) defined by the following Equation (1) is calculated using the first energy (A) and the second energy (B) deduced by the above-mentioned method.

$$C_{si}^{sol}=A-B+\mu_1-\mu_2 \quad \text{Equation (1)}$$

The solubility parameter value calculated as described above quantitatively indicates solubility of carbon changed depending on the metal contained in the silicon-based molten composition. In the case in which the metal contained in the silicon-based molten composition is changed, solubility of carbon is changed, and the solubility parameter value of the silicon-based molten composition is also changed.

Among the silicon-based molten compositions having various solubility parameter values as described above, the silicon-based molten composition containing the metal according to the exemplary embodiment of the present invention has a solubility parameter ($C_{si}^{sol}$) value satisfying $0.70 \leq C_{si}^{sol} \leq 1.510$, preferably $0.72 \leq C_{si}^{sol} \leq 1.36$. The reason is as follows: a solubility parameter value of 1.510 or less indicates that the silicon-based molten composition is more stable in view of thermodynamic.

Hereinafter, a manufacturing method of a SiC single crystal will be described, and in the manufacturing method according to an exemplary embodiment, the silicon-based molten composition described above is used. Hereinafter, a description of the solubility parameter, and the like, described above will be omitted.

A SiC seed crystal is prepared in a graphite crucible, and an initial molten composition containing silicon and a metal are injected into the graphite crucible (initial injection).

Here, the metal is a metal satisfying $0.70 \leq C_{si}^{sol} \leq 1.510$ with respect to a solubility parameter ($C_{si}^{sol}$) defined by Equation (1), and the metal may include any metal satisfying $0.70 \leq C_{si}^{sol} \leq 1.510$. More preferably, the metal may be a metal satisfying $0.72 \leq C_{si}^{sol} \leq 1.36$.

The metal according to the exemplary embodiment of the present invention may include at least two kinds of metals. Any combination of at least two kinds of metals may be used as long as these metals may satisfy $0.70 \leq C_{si}^{sol} \leq 1.510$, more preferably, $0.72 \leq C_{si}^{sol} \leq 1.36$ with respect to the solubility parameter ($C_{si}^{sol}$) defined by Equation (1).

At least two kinds of metals may include at least two metals selected from the group consisting of aluminum (Al), nickel (Ni), hafnium (Hf), gallium (Ga), and tantalum (Ta). As an example, the metal may include a combination of aluminum and nickel, a combination of aluminum and hafnium, a combination of gallium and tantalum, a combination of gallium and hafnium, or a combination of aluminum and tantalum.

The metal may be contained in a content of 25 to 85 parts by weight based on 100 parts by total weight of silicon. Alternatively, the metal may be contained in a content of 20 to 50 at % based on the silicon-based molten composition. In the case in which the content of the metal is equal to or less than 25 parts by weight based on 100 parts by total weight of silicon, solubility of carbon in the silicon-based molten solution is low, and it is impossible to obtain a sufficient growth rate of the SiC single crystal. Further, in the case in which the content of the metal is equal to or higher than 85 parts by weight based on 100 parts by total weight of silicon, a compound of silicon and the metal may be formed, or polycrystallization of SiC may easily occur, such that growth of the single crystal may be difficult. Further, in the case in which the metal includes at least two kinds of metals different from each other, the content of the metal may satisfy the above-mentioned parts by weight.

Therefore, regardless of the kind of metals, the metal may be contained in a content of 25 to 85 parts by weight, preferably, 60 to 70 parts by weight based on 100 parts by total weight of silicon. Alternatively, regardless of the kind of metal, the metal may be contained in a content of 20 to 50 at % based on the silicon-based molten composition. In the case in which the metal includes two kinds of metals, a content of one of the metals may be larger than that of the other thereof.

Next, the graphite crucible into which the seed crystal and the initial molten composition are injected is heated under an inert atmosphere such as Ar, or the like. Carbon is eluted in the graphite crucible by the heating as described above, and the initial molten composition is changed into a silicon-based molten composition containing carbon, silicon, and the metal.

As an example, a heater may be used in the heating, a method using a combination of an induction coil and a susceptor, a resistance heating method, or the like, may be used, but the present invention is not limited thereto.

After the graphite crucible reaches a predetermined temperature, a temperature of the molten solution in the graphite crucible is slowly decreased, and solubility of carbon in the molten solution is decreased. Therefore, when SiC is supersaturated in the vicinity of the seed crystal, supersaturation results in growth of SiC single crystal on the seed crystal.

Meanwhile, the SiC single crystal further grows by receiving silicon and carbon from a molten solution. Therefore, silicon and carbon contained in the molten solution are gradually decreased, and a condition for precipitating SiC from the molten solution may be changed. In this case, it is possible to allow a component composition of the molten solution to be within a predetermined range by adding silicon and carbon with the passage of time so as to be suitable for the component composition of the molten solution. The added silicon and carbon may be continuously or discontinuously injected.

Example

Si, Al, and Ni fine powders (raw materials) having an average particle size of 30 to 50 μm were prepared. Next, Si (56 at %), Al (4 at %), and Ni (40 at %) were mixed with each other so that a weight of an entire mixture was 50 g or more. Here, the mixing was performed by putting the fine powders (raw materials) into a plastic container and rotating the plastic container at a rotation speed of 80 rpm for 1 hour using a 3-dimensional mixer.

Then, a crucible (internal volume: 20 cc) made of isotropic graphite having a porosity of 15% was filled with the mixed raw materials (filling rate 30%), and the crucible was positioned at the internal center of an apparatus for a resistance heating method under a high temperature atmosphere.

After removing air in the crucible by operating a vacuum pump at room temperature, Ar gas was put into the crucible, such that a pressure in the crucible was maintained at an atmospheric pressure. The crucible was heated 1800 degrees at 10 degrees/min to completely melt the raw materials of the mixture in the crucible, and the temperature of the crucible was maintained at 1800 degrees for 6 hours to allow a carbon component to be dissolved in a melt from an inner wall of the crucible.

Then, the crucible was slowly cooled, such that the melt in the crucible was coagulated. A coagulation in the crucible was cut at a predetermined size (central diameter: 10 mm, length: 5 mm), thereby forming a sample. Thereafter, this sample was ground to a powder having an average particle size of 5 μm.

A content of carbon contained in the powder was measured by performing an infrared absorption method on a carbon dioxide component generated at the time of high-temperature combustion using a carbon analyzer.

Comparative Example

Si, Al, and Ni fine powders (raw materials) having an average particle size of 30 to 50 μm were prepared. Next, Si (76.8 at %), Al (4 at %), and Ni (19.2 at %) were mixed with each other so that a weight of an entire mixture was 50 g or more. The same graphite crucible as in Example was filled with the mixed powder (filling rate: 30%), and the crucible was heated and cooled in the same manner as in Example. Thereafter, a content of carbon was measured with respect to a coagulation sample.

As a result of comparing the contents of carbon in Example and Comparative Example, it may be appreciated that the content of carbon in the molten solution in Example was equal to or higher than 10 times that in Comparative Example. That is, it may be appreciated that in a molten composition containing a metal satisfying a predetermined parameter value as in the Example of the present invention, solubility of carbon with respect to silicon is increased.

Figure 4:
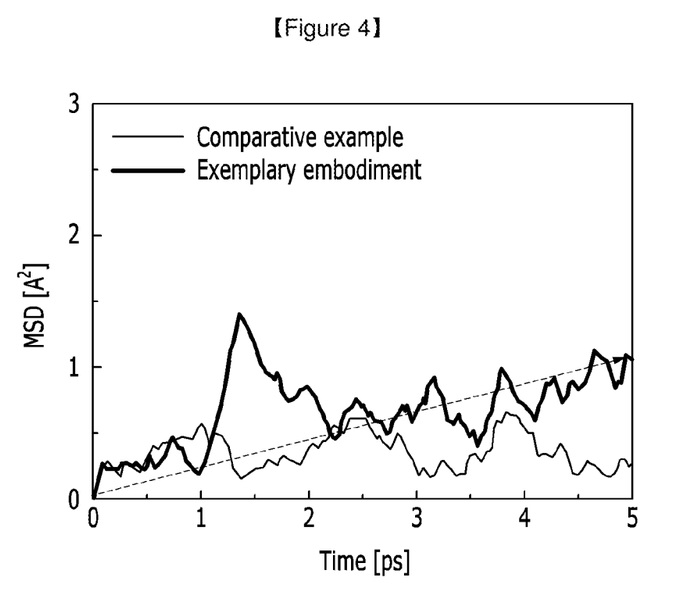
FIG. 4 is a graph illustrating mean square displacement according to Example and Comparative Example.
Figure 5:
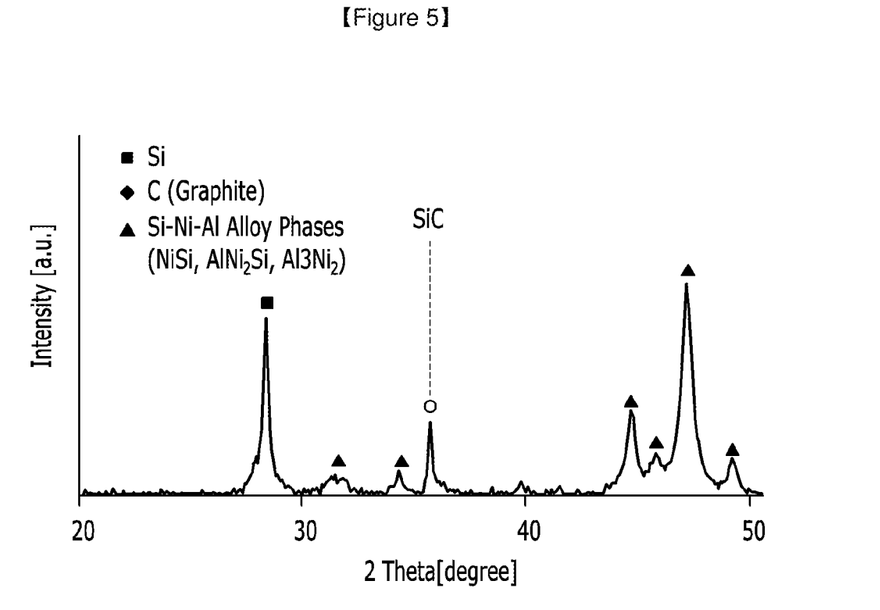
FIG. 5 is a graph illustrating x-ray diffraction (XRD) analysis results according to Example.

Hereinafter, silicon-based molten compositions in Example and Comparative Example will be described with reference to FIGS. 3A to 5. (a) of FIG. 3 is a morphological simulation image according to Example, and (b) of FIG. 3 is a morphological simulation image according to Comparative Example, FIG. 4 is a graph illustrating mean square displacement according to Example and Comparative Example, and FIG. 5 is a graph illustrating x-ray diffraction (XRD) analysis results according to Example.

Figure 3:
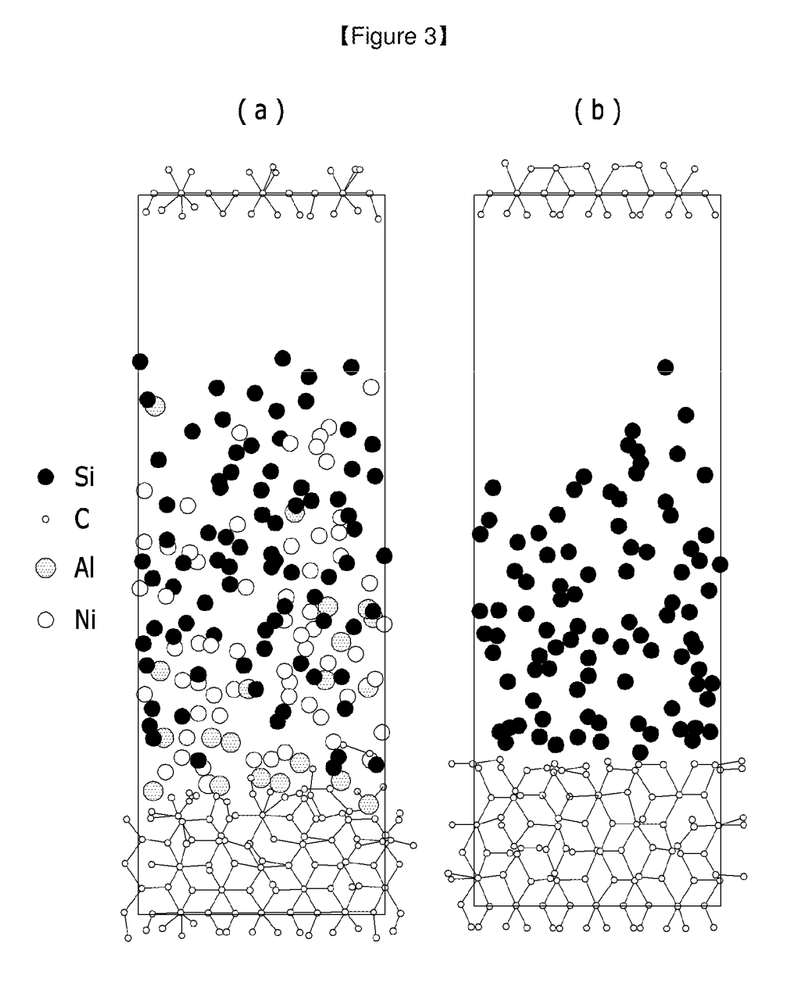

FIGS. 3A and 3B illustrate results obtained by simulating diffusion of carbon using an ab initio molecular dynamics (AIMD) calculation method. In order to model a phenomenon that carbon was dissolved on a surface of a graphite crucible at the time of melting silicon and a metal in the graphite crucible, a model composed of a graphite layer, a silicon layer, and a metal layer was used. FIG. 3($a$), which corresponds to Example, illustrates an atomic structure after 60 nickel atoms, 6 aluminum atoms, and 96 silicon atoms were put and melted onto a surface of a graphite at a high temperature, and kept for 5 ps under the NVT ensemble condition at which the number of atoms and a volume and a temperature of a system were constant. FIG. 3($b$), which corresponds to Comparative Example, illustrates an atomic structure after only 96 silicon atoms were put onto the surface of the graphite without adding a metal and then kept for 5 ps under the NVT ensemble condition. AIMD calculation was performed using a VASP code, and an exchange-correlation function indicating interaction between electrons was evaluated by a generalized-gradient approximation (GGA) method. A kinetic energy cutoff of the electrons was set to 300 eV, and in the case of a k-point, gamma-only point was used. Particularly, since among the carbon atoms used in the modeling, in a lowermost carbon atom, a dangling bond was present, the dangling bond was terminated by a hydrogen atom, and fixed so that there was no movement during a calculation time, thereby minimizing a calculation error capable of being generated by a periodic boundary condition.

As a result of analyzing the silicon-based molten compositions in Example and Comparative Example using software, as illustrated in FIGS. 3($a$) and ($b$), it may be appreciated that in Example (FIG. 3($a$)), bonds between carbon atoms positioned on the surface of the graphite crucible and illustrated in a state in which they were linked with each other were broken by the metal atom contained in the silicon-based molten composition. On the contrary, it may be appreciated that in Comparative Example (FIG. 3($b$)), bonds between carbon atoms positioned at a lower end and linked with each other were mostly maintained as they were.

That is, it may be appreciated that in the case in which a silicon-based molten composition further contains a metal element satisfying a predetermined parameter as in the Example according to the present invention, bonds between carbon atoms are broken, and the carbon atoms between which the bonds are broken may be dissolved in the silicon-based molten composition. Therefore, in Example, solubility of carbon in the silicon-based molten composition may be improved.

Hereinafter, mean square displacement of the carbon atom illustrated in FIG. 4 will be described.

It may be appreciated that in the case of the silicon-based molten composition containing nickel and aluminum satisfying the predetermined parameter according to Example, a mean square displacement value was increased with the passage of time (5 ps). Therefore, it may be appreciated that a slope (indicated by a dotted line in FIG. 4) of the mean square displacement value with respect to time had a predetermined value.

On the contrary, in the case of using a silicon-based molten composition not containing a metal except for silicon (Si) as in Comparative Example, in spite of the passage of time, a mean square displacement value of carbon (C) was changed only between about 0 to 0.5.

The larger the slope of the mean square displacement of carbon with respect to time, the higher the solubility of carbon. The graph according to Example illustrated in FIG. 4 had a predetermined slope, but the graph according to Comparative Example had a slope almost close to zero. That is, it may be confirmed that solubility of carbon in the silicon-based molten composition was excellent as compared to Comparative Example.

Hereinafter, solubility of carbon of silicon-based molten composition according to Examples 1 and 2 and Comparative Example will be described with reference to Table 1.

More specifically, Table 1 illustrates a result obtained by measuring an amount of carbon dissolved in a coagulation after silicon, nickel, and aluminum fine powders were mixed with each other depending on each component composition, put into a graphite crucible, and melted at 1800 degrees (C) for 6 hours.

TABLE 1

| | Composition | Solubility of Carbon (at %) |
|---|---|---|
| Example 1 | $Si_{0.56}Ni_{0.4}Al_{0.04}$ | 3.88 |
| Example 2 | $Si_{0.768}Ni_{0.192}Al_{0.04}$ | 0.84 |
| Comparative Example | Si | 0.39 |

As illustrated in Table 1, it may be appreciated that the silicon-based molten composition containing metals (nickel and aluminum) satisfying a predetermined parameter according to Examples 1 and 2 had higher solubility of carbon as compared to the silicon-based molten composition that did not contain the metal satisfying the predetermined parameter according to Comparative Example. Particularly, it was confirmed that the silicon-based molten composition according to Example 1 had the highest solubility of carbon.

FIG. 5 is a graph illustrating x-ray diffraction (XRD) analysis results of the silicon-based molten composition according to Example 1, and a significant intensity was confirmed at a peak indicating SiC. Therefore, it was confirmed that solubility of carbon in the silicon-based molten composition according to Example 1 was high, and thus, a precipitation amount of silicon carbide (SiC) precipitated from the silicon-based molten composition according to Example 1 was excellent.

The invention claimed is:

1. A silicon-based molten composition comprising:
   silicon, carbon, and a metal satisfying $0.70 \leq C_{si}^{sol} \leq 1.510$ with respect to a solubility parameter ($C_{si}^{sol}$) defined by the following Equation (1),
   wherein the silicon-based molten composition is prepared in a graphite crucible and is used to form a SiC single crystal by a solution method, and
   the metal includes at least two kinds of metals selected from the group consisting of hafnium (Hf), gallium (Ga), and tantalum (Ta) and selected from the group consisting of tantalum (Ta) and hafnium (Hf), and
   the metal is positioned in an interstitial site between silicon crystal lattices:

$$C_{si}^{sol} = A - B + \mu_1 - \mu_2 \quad \text{Equation (1)}$$

in Equation (1), A is first energy (A) of a first evaluation lattice containing silicon atoms, carbon atoms, and metal atoms, in a silicon crystal lattice containing the metal atoms and the carbon atoms; B is second energy (B) of a second evaluation lattice containing silicon atoms and metal atoms, in a silicon crystal lattice containing the metal atoms; $\mu_1$ is −5.422 as a constant value, which is a chemical potential obtained by dividing total energy of diamond crystal structured silicon by the number of silicon atoms present in a unit lattice; and $\mu_2$ is −9.097 as a constant value, which is a chemical potential obtained by dividing total energy of diamond crystal structured carbon by the number of carbon atoms present in the unit lattice.

2. The silicon-based molten composition of claim 1, wherein:
   the metal satisfies $0.72 \leq C_{si}^{sol} \leq 1.36$ with respect to the solubility parameter ($C_{si}^{sol}$) defined by Equation (1).

3. The silicon-based molten composition of claim 1, wherein:
   the metal further includes at least one metal selected from the group consisting of aluminum and nickel.

4. The silicon-based molten composition of claim 1, wherein:
   the metal is contained in a content of 25 to 85 parts by weight based on 100 parts by total weight of silicon.

5. The silicon-based molten composition of claim 1, wherein:
   the metal is contained in a content of 20 to 50 at %.

6. A manufacturing method of a SiC single crystal, the manufacturing method comprising:
   preparing a SiC seed crystal,
   preparing a molten solution containing silicon, carbon, and a metal in a graphite crucible; and
   supercooling the molten solution to grow a SiC single crystal on the SiC seed crystal,
   wherein the metal satisfies $0.70 \leq C_{si}^{sol} \leq 1.510$ with respect to the solubility parameter ($C_{si}^{sol}$) defined by Equation (1), and
   the metal includes at least two kinds of metals selected from the group consisting of hafnium (Hf), gallium (Ga), and tantalum (Ta) and selected from the group consisting of tantalum (Ta) and hafnium (Hf), and
   the metal is positioned in an interstitial site between silicon crystal lattices:

$$C_{si}^{sol} = A - B + \mu_1 - \mu_2 \quad \text{Equation (1)}$$

in Equation (1), A is first energy (A) of a first evaluation lattice containing silicon atoms, carbon atoms, and metal atoms, in a silicon crystal lattice containing the metal atoms and the carbon atoms; B is second energy (B) of a second evaluation lattice containing silicon atoms and metal atoms, in a silicon crystal lattice containing the metal atoms; $\mu_1$ is −5.422 as a constant value, which is a chemical potential obtained by dividing total energy of diamond crystal structured silicon by the number of silicon atoms present in a unit lattice; and $\mu_2$ is −9.097 as a constant value, which is a chemical potential obtained by dividing total energy of diamond crystal structured carbon by the number of carbon atoms present in the unit lattice.

7. The manufacturing method of claim 6, wherein:
   the metal satisfies $0.72 \leq C_{si}^{sol} \leq 1.36$ with respect to the solubility parameter ($C_{si}^{sol}$) defined by Equation (1).

8. The manufacturing method of claim 6, wherein:
   the metal further includes at least one metal selected from the group consisting of aluminum and nickel.

9. The manufacturing method of claim 6, wherein:
the metal is contained in a content of 25 to 85 parts by weight based on 100 parts by total weight of silicon.

10. The manufacturing method of claim 6, wherein:
the metal is contained in a content of 20 to 50 at %.

11. The manufacturing method of claim 6, wherein:
force applied to the silicon atom, the carbon atom, and the metal atom in the first evaluation lattice is ±0.01 eV/Å or less.

12. The manufacturing method of claim 6, wherein:
force applied to the metal atom and the silicon atom in the second evaluation lattice is ±0.01 eV/Å or less.

13. The manufacturing method of claim 6, wherein:
the first energy,
is deduced by a process of substituting the silicon atom with the metal atom in the silicon crystal lattice, and
a process of substituting the silicon atom with the carbon atom to form the first evaluation lattice.

14. The manufacturing method of claim 13, wherein:
the second energy,
is deduced by a process of substituting the silicon atom with the metal atom in the silicon crystal lattice to form the second evaluation lattice.

15. The manufacturing method of claim 14, wherein:
the metal atom includes first and second metal atoms different from each other, and
a distance between the first and second metal atoms is 5 Å or less.

16. The manufacturing method of claim 14, wherein:
the second evaluation lattice contains the silicon atom and the metal atom, which are positioned within a radius of 6 Å based on the silicon atom positioned adjacently to the metal atom.

17. The manufacturing method of claim 13, wherein:
the first evaluation lattice contains the carbon atom, the silicon atom, and the metal atom, which are positioned within a radius of 6 Å based on the carbon atom.

18. The manufacturing method of claim 6, wherein:
the first energy, the second energy, the first constant, and the second constant are deduced using a density functional theory (DFT) method using a Vienna Ab-Initio Simulation Package (VASP) code.

* * * * *